US006641986B1

(12) United States Patent
Zhang et al.

(10) Patent No.: US 6,641,986 B1
(45) Date of Patent: Nov. 4, 2003

(54) ACETYLENIC DIOL SURFACTANT SOLUTIONS AND METHODS OF USING SAME

(75) Inventors: Peng Zhang, Quakertown, PA (US); Danielle Megan King, Emmaus, PA (US); Eugene Joseph Karwacki, Orefield, PA (US); Leslie Cox Barber, Cave Creek, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/218,068

(22) Filed: Aug. 12, 2002

(51) Int. Cl.[7] .............................. G03F 7/30; G03F 7/38; C11D 17/00; B01D 12/00; B01F 17/00
(52) U.S. Cl. .................... 430/325; 430/271.1; 430/327; 430/331; 510/175; 510/176; 510/421; 516/204; 568/616; 568/855
(58) Field of Search ................................. 430/327, 329, 430/331, 325, 271.1; 510/176, 421, 175; 568/616, 855; 516/204

(56) References Cited

U.S. PATENT DOCUMENTS

| 4,374,920 | A | * | 2/1983 | Wanat et al. | ................ | 430/331 |
|---|---|---|---|---|---|---|
| 4,833,067 | A | * | 5/1989 | Tanaka et al. | ............... | 430/325 |
| 5,064,749 | A | * | 11/1991 | Matsumoto et al. | ......... | 430/325 |
| 5,098,478 | A | * | 3/1992 | Krishnan et al. | .............. | 106/23 |
| 5,650,543 | A | * | 7/1997 | Medina | ....................... | 568/616 |
| 5,756,267 | A | * | 5/1998 | Matsuda et al. | ............. | 430/325 |
| 5,977,041 | A | * | 11/1999 | Honda | ......................... | 510/175 |
| 6,261,745 | B1 | * | 7/2001 | Tanabe et al. | .............. | 430/325 |
| 6,284,718 | B1 | * | 9/2001 | Simon | ......................... | 510/421 |
| 6,313,182 | B1 | | 11/2001 | Lassila et al. | ............... | 516/204 |
| 2001/0021478 | A1 | * | 9/2001 | Wakiya et al. | .............. | 430/329 |
| 2002/0055660 | A1 | | 5/2002 | Lassila et al. | ............... | 568/616 |
| 2002/0077259 | A1 | * | 6/2002 | Skee | .......................... | 510/175 |
| 2002/0106589 | A1 | * | 8/2002 | Rodney et al. | .............. | 430/325 |

FOREIGN PATENT DOCUMENTS

| EP | 0178495 | 3/1990 |
|---|---|---|
| EP | 0231028 | 8/1991 |
| EP | 1115035 | 7/2001 |
| JP | 2002148821 | 5/2002 |

\* cited by examiner

*Primary Examiner*—Richard L. Schilling
(74) *Attorney, Agent, or Firm*—Rosaleen P. Morris-Oskanian

(57) ABSTRACT

Aqueous solutions comprising one or more acetylenic diol type surfactants are used to improve the wettability of a substrate surface by lowering the contact angle of the aqueous developer solution are enclosed herein. In one embodiment, the aqueous solution is used to prepare the surface of the substrate prior to development of the resist coating layer.

19 Claims, No Drawings

ACETYLENIC DIOL SURFACTANT SOLUTIONS AND METHODS OF USING SAME

BACKGROUND OF THE INVENTION

The present invention relates generally to a method for the manufacture of semiconductor devices. More specifically, the present invention relates to an aqueous solution for treating the surface of a substrate and a method for using same.

By the year 2004, the newly updated International Technology Roadmap for Semiconductors (ITRS) states that critical features, as measured by the gate length of MPUs and the ½ pitch of Dynamic Random Access Memory (DRAM) devices, will break the 100 nm barrier. Critical Dimension (CD) is one process control lever that is closely monitored. At the 90 nm technology node, the CD control, as measured by the 3-sigma requirement, will approach 3.0 nm which is approximately the size of the polymer molecules that comprise the photoresist. Furthermore, the size of the wafers being processed is growing larger. As a result, this magnitude of control has to be reproduced on larger, 300 mm wafers.

Paralleling the reduction in line geometries is the need for tighter control over the lithographic process. Lithography is a critical process for the manufacture of semiconductor components and integrated circuits (IC). In brief, the typical lithography process involves coating a substrate with a positive or negative resist layer, exposing the substrate to a radiation source to provide an image, and developing the substrate to form a patterned resist layer on the substrate. This patterned layer acts as a mask for subsequent substrate patterning processes such as etching, doping, and/or coating with metals, other semiconductor materials, or insulating materials.

One strategy for addressing the need for tighter CD control may be to improve the development process. This approach becomes increasingly important because the next generation of photoresists for 193 nm lithography will be more hydrophobic, and, thus, be more resistant to developer wetting. Poor wetting of the photoresist by the developer can lead to defects as well as a reduction in CD control. It is anticipated that these problems may be amplified with the move towards 300 mm processing because more surface area on the substrate will need to be simultaneously wetted. The current method to improve the wetting on the resist surface prior to photoresist development uses deionized water (DI). This method, however, may not be adequate to prepare the surface of the substrate for the future generation of resists.

The ability to reduce the surface tension of water at the air and liquid interface is of great importance in a variety of applications because decreased surface tension generally relates to increased wetting of water on the substrate surface. Surface tension reduction in water-based systems is generally achieved through the addition of surfactants. Equilibrium surface tension performance is important when the system is at rest, though the ability to reduce surface tension under dynamic conditions is of great importance in applications where high surface creation rates are used, i.e., spin coating, rolling, spray coating, and the like. Dynamic surface tension provides a measure of the ability of the solution to lower surface tension and provide wetting under high speed application conditions. Further, in certain applications such as during spray application, it is advantageous that the surfactant reduces the surface tension of the formulation in a manner that minimizes bubble generation and foaming.

Surfactants have been added to pre-rinse solutions prior to the development step to improve the contrast in positive photoresist developing. For example, EP 0231028 B1 describes treating a photoresist film in a pre-dip bath containing an organic base and cationic solution and rinsing with DI water prior to developing the photoresist film in a developer solution containing an organic base and fluorochemical surfactant. Similarly, EP 0178495 B1 describes treating a photoresist film with a pre-dip solution containing an aqueous alkali metal base and a fluorochemical or carboxylated surfactant and rinsing with DI water prior to developing the photoresist film in a developer solution containing an aqueous alkali metal hydroxide and optionally a fluorochemical or carboxylated surfactant. Both references employ a two-solution process that includes a DI water rinse step between the pre-dip and development steps. It may be desirable, however, to treat the surface of the substrate and achieve the benefits of improved wetting in fewer steps. It may also be desirable to treat the surface of the substrate with a dynamic rather than a static rinse.

Japanese patent application 2002/148821 describes coating a wafer having a fluorine and silicon-based polymer resist with a fluorosurfactant to improve the wettablity of the developer.

Accordingly, there is a need in the art to provide an aqueous solution to prepare the surface of a substrate prior to development or other steps within the lithography process. There is a further need to provide aqueous solutions that improve the wettability of the surface, for example, by lowering the contact angle of a subsequently applied processing solution on the substrate. There is also a need in the art for aqueous solutions comprising a surfactant that works effectively in high-speed applications without undesirable foaming or bubble generation. Further, there is a need in the art for an aqueous solution that reduces the number of treatment steps.

All references cited herein are incorporated herein by reference in their entirety.

BRIEF SUMMARY OF THE INVENTION

The present invention satisfies some, if not all, of the needs of the art by providing an aqueous solution comprising one or more acetylenic diol type surfactants to prepare the surface of a substrate. The aqueous solution of the present invention may be used to modify the character of the substrate surface from a hydrophobic surface to a substantially more hydrophilic surface, or vice versa. As a result of this treatment, the substrate may exhibit improved wettability, enhanced development, improved CD control, reduced defects, and/or increased throughput by achieving faster developing speeds.

Specifically, in one embodiment of the present invention, there is provided a method for improving the wettability of a substrate. The method comprises the steps of contacting the substrate with an aqueous solution comprising about 10 ppm to about 10,000 ppm of at least one surfactant having the formula (I) or (II):

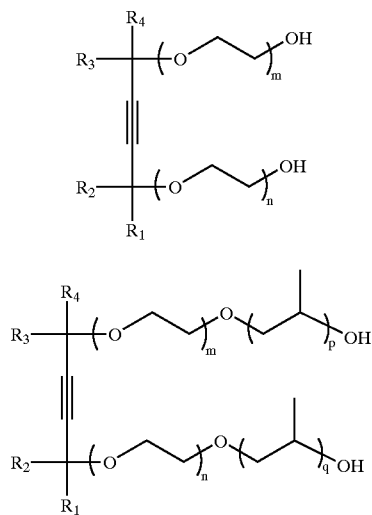

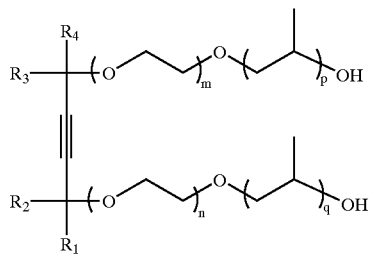

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20; coating the substrate with a resist coating to provide a resist-coated substrate; exposing at least a portion of the resist-coated substrate to a radiation source for a time sufficient to provide a pattern on the resist coating; and applying the aqueous developer solution to the substrate to dissolve at least a portion of the resist coating. In certain embodiments, the contacting step may be performed after the coating step.

In a further embodiment of the present invention, there is provided a method for improving the wettability of a substrate. The method comprises the steps of contacting a substrate with an aqueous solution comprising about 10 ppm to about 10,000 ppm of at least one surfactant having the formula:

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20; coating the substrate with a resist coating to provide a resist-coated substrate; exposing at least a portion of the resist-coated substrate to a radiation source for a time sufficient to provide a pattern on the resist coating; and applying the aqueous developer solution to the substrate to dissolve at least a portion of the resist coating. In certain embodiments, the contacting step is performed before the coating step.

In yet another embodiment of the present invention, there is provided a method for improving the wettability of a substrate by lowering the contact angle of an aqueous developer solution on the surface of the substrate. The method comprises the steps of contacting the substrate with an aqueous solution comprising about 10 ppm to about 10,000 ppm of at least one surfactant having the formula (I) or (II):

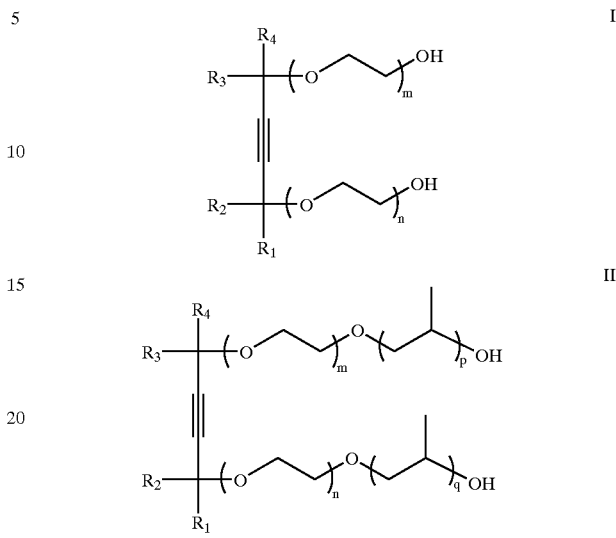

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20; coating the substrate with a resist coating to provide a resist-coated substrate; exposing at least a portion of the resist-coated substrate to a radiation source for a time sufficient to provide a pattern on the resist coating; contacting the resist-coated substrate with the aqueous solution; and applying the aqueous developer solution to the substrate to dissolve at least a portion of the resist coating.

In yet another embodiment of the present invention, there is provided an aqueous solution having about 10 to about 10,000 ppm of at least one surfactant having the formula (I) or (II):

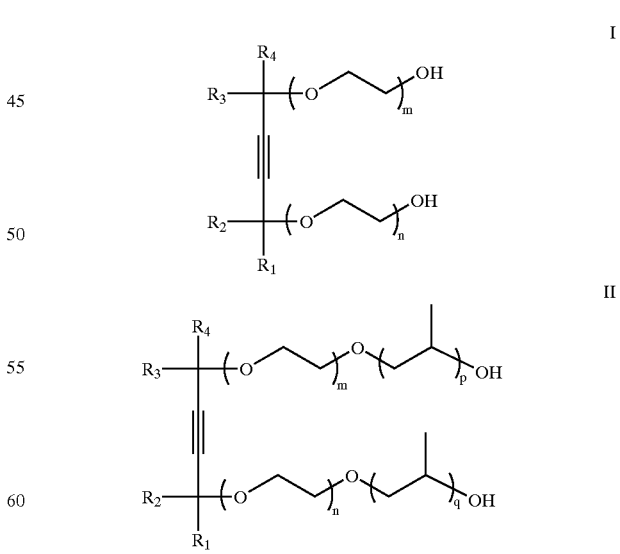

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20.

In a still further embodiment of the present invention, there is provided an aqueous solution comprising about 10 to about 10,000 ppm of a surfactant having the formula:

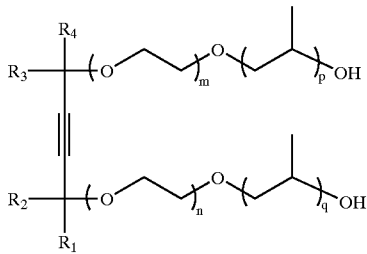

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20.

These and other aspects of the invention will become apparent from the following detailed description.

DETAILED DESCRIPTION OF THE INVENTION

The present invention is directed to aqueous solutions having at least one surfactant that is an acetylenic diol derivative and methods for using same. The aqueous solution of the present invention may be used to modify the character of the substrate surface from a hydrophobic surface to a substantially more hydrophilic surface, or vice versa. For example, in certain embodiments, the aqueous solution of the present invention may be used to treat a surface of a substrate that be coated with a layer of resist coating prior to the development of the resist. In this manner, the wettability of the substrate surface may be improved.

The term "aqueous solution", as used herein, describes a solvent or liquid dispersing medium which comprises at least 80 weight percent, preferably 90 weight percent, and more preferably at least 95 weight percent water. In embodiments where a solvent is used in addition to or in place of water, the solvent selected will not react with the acetylenic diol derived surfactant contained therein or the substrate. Suitable solvents include, but are not limited to, hydrocarbons (e.g. pentane or hexane); halocarbons (e.g. Freon 113); ethers (e.g. ethylether ($Et_2O$), tetrahydrofuran ("THF") or diglyme (diethyleneglycol dimethyl ether)); nitriles (e.g. $CH_3CN$); or aromatic compounds (e.g. benzotrifluoride). Still further exemplary solvents include lactates, pyruvates, and diols. These solvents include, but are not limited to, acetone, 1,4-dioxane, 1,3-dioxolane, ethyl acetate, cyclohexanone, acetone, 1-methyl-2-pyrodidianone (NMP), and methyl ethyl ketone. Other solvents, include dimethylformamide, dimethylacetamide, N-methyl pyrrolidone, ethylene carbonate, propylene carbonate, glycerol and derivatives, naphthalene and substituted versions, acetic acid anyhydride, propionic acid and propionic acid anhydride, dimethyl sulfone, benzophenone, diphenyl sulfone, phenol, m-cresol, dimethyl sulfoxide, diphenyl ether, terphenyl, and the like. Still further solvents include propylene glycol propyl ether (PGPE), 3-heptanol, 2-methyl-1-pentanol, 5-methyl-2-hexanol, 3-hexanol, 2-heptano, 2-hexanol, 2,3-dimethyl-3-pentanol, propylene glycol methyl ether acetate (PGMEA), ethylene glycol, isopropyl alcohol (IPA), n-butyl ether, propylene glycol n-butyl ether (PGBE), 1-butoxy-2-propanol, 2-methyl-3-pentanol, 2-methoxyethyl acetate, 2-butoxyethanol, 2-ethoxyethyl acetoacetate, 1-pentanol, and propylene glycol methyl ether. The solvents enumerated above may be used alone or in combination with two or more solvents.

The aqueous solutions of the present invention contain one or more nonionic surfactants that are acetylenic diol derivatives. The surfactants of the present invention may be represented by the following formula I or formula II:

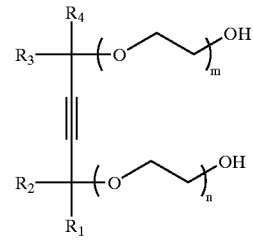

I

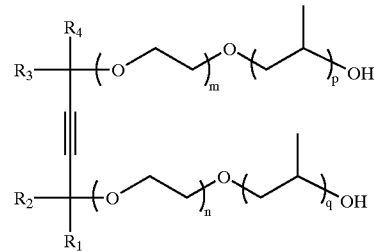

II wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20. The surfactants are commercially available from Air Products and Chemicals, Inc. of Allentown, Pa., the assignee of the present invention, under the trade names SURFYNOL® and DYNOL®. In certain preferred embodiments, the acetylenic diol portion of the molecule of formulas I or II is 2,4,5,9-tetramethyl-5-decyne-4,7-diol or 2,5,8,11-tetramethyl-6-dodecyne-5,8-diol. The acetylenic diol derived surfactants of the present invention may be prepared in a number of ways including the methods described, for example, in U.S. Pat. No. 6,313,182 and EP 1115035A1 which are assigned to the assignee of the present invention and incorporated herein by reference in their entirety.

In formula I and II, the alkylene oxide moieties represented by ($OC_2H_4$) are the (n+m) polymerized ethylene oxide (EO) molar units and the moieties represented by ($OC_3H_6$) are the (p+q) polymerized propylene oxide (PO) molar units. The value of (n+m) may range from 0 to 30, preferably from 1.3 to 15, and more preferably from 1.3 to 10. The value of (p+q) may range from 0 to 30, preferably from 1 to 10, and more preferably from 1 to 2.

In certain embodiments, the aqueous solution may contain a dispersant. The amount of dispersant that is added to the aqueous solution ranges from about 10 to about 10,000 ppm, preferably about 10 to about 5,000 ppm, and more preferably from about 10 to about 1,000 ppm. The term dispersant, as used herein, describes compounds that enhance the dispersion of particles such as dust, processing residue, hydrocarbons, metal oxides, pigment or other contaminants within the aqueous solution. Dispersants suitable for the present invention preferably have a number average molecular weight that ranges from about 10 to about 10,000.

In certain preferred embodiments, the dispersant may be an ionic or a nonionic compound. The ionic or nonionic compound may further comprise a copolymer, an oligomer, or a surfactant, alone or in combination. The term copolymer, as used herein, relates to a polymer compound consisting of more than one polymeric compound such as block, star, or grafted copolymers. Examples of a nonionic copolymer dispersant include polymeric compounds such as the tri-block EO-PO-EO co-polymers PLURONIC® L121, L123, L31, L81, L101 and P123 (BASF, Inc.). The term oligomer, as used herein, relates to a polymer compound consisting of only a few monomer units. Examples of ionic oligomer dispersants include SMA® 1440 and 2625 oligomers (Elf Alfochem).

The dispersent may further comprise a surfactant. Typical surfactants exhibit an amphiphilic nature, meaning that they can be both hydrophilic and hydrophobic at the same time. Amphiphillic surfactants possess a hydrophilic head group or groups, which have a strong affinity for water and a long hydrophobic tail, which is organophilic and repels water. The surfactants may be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-102, X-45, X-15 and alcohol ethoxylates such as BRIJ® 56 ($C_{16}H_{33}(OCH_2CH_2)_{10}OH$)(ICl), BRIJ® 58 ($C_{16}H_{33}(OUCH_2CH_2)_{20}OH$)(ICl). Still further exemplary surfactants include alcohol (primary and secondary) ethoxylates, amine ethoxylates, glucosides, glucamine, polyethylene glycols, poly(ethylene glycol-co-propylene glycol), or other surfactants provided in the reference *McCutcheon's Emulsifiers and Detergents*, North American Edition for the Year 2000 published by Manufacturers Confectioners Publishing Co. of Glen Rock, N.J.

Various other additives may be optionally added to the aqueous solution depending upon the application. These additives may include, but are not limited to, colorants, wetting agents, antifoamers, buffering agents, and other surfactants. Generally, the amount of each of these additives would be about 0.0001 to 1, more preferably 0.0001 to 0.1 percent by weight, based upon the total weight of the aqueous solution. In embodiments where one or more additional surfactant is added to the aqueous solution, the surfactant may be any of the surfactants disclosed herein.

The aqueous solution of the present invention may be prepared by mixing the acetylenic diol derivative surfactant with water and/or other solvents and any additional additives. In certain embodiments, the mixing may be done at a temperature range of about 40 to 60° C. to affect dissolution of the ingredients contained therein. The resulting aqueous solution may optionally be filtered to remove any undissolved particles that could potentially harm the substrate.

The aqueous solution of the present invention is applied to, or contacts, the surface of a substrate. Suitable substrates include, but are not limited to, materials such as gallium arsenide ("GaAs"), silicon, tantalum, copper, ceramics, aluminum/copper alloys, polyimides, and compositions containing silicon such as crystalline silicon, polysilicon, amorphous silicon, epitaxial silicon, silicon dioxide ("$SiO_2$"), silicon nitride, doped silicon dioxide, and the like. Further exemplary substrates include silicon, aluminum, or polymeric resins. In certain embodiments, the surface of the substrate may be primed with a conventional adhesion promoter such as hexamethyldisilizane (HMDS) before a resist coating is applied. In certain preferred embodiments of the present invention, however, the treatment of the surface with the aqueous solution of the present invention prior to resist coating eliminates the need for HMDS.

The aqueous solution may be used to treat the surface of a substrate before and/or after the surface of the substrate has been coated with a resist coating. In other words, the contacting step may occur in one or more steps either before and/or after the substrate has been coated with resist. In embodiments wherein the contacting step occurs before coating the substrate with resist, the aqueous solution may improve the wetting of the resist coating to the substrate surface. In this case, the aqueous solution alters the character of the surface from a more hydrophilic nature to a more hydrophobic one, facilitating the subsequent coating of a hydrophobic organic material such as resist or low-k dielectrics. In embodiments wherein the contacting step occurs after coating the substrate with resist, the aqueous solution may improve the wetting of the aqueous developer solution to the resist-coated surface. In this case, it is believed that the application of the aqueous solution may alter the character of the surface from a more hydrophobic surface to a more hydrophilic surface.

In certain preferred embodiments, the contacting step occurs after the substrate has been coated with a resist coating. Some non-limiting examples of resist coatings include phenolic resists; resist coatings for 157 nm line widths; resist coatings for 193 nm line widths such as IBM COBRA 3000 (cyclic olefine) and JSR AT 5000 (COMA) having iodonium photo acid generators (PAGs); deep ultraviolet (DUV) resists such as Shipley ApexE (modified polyhydroxystyrene) and Shipley UV6 (copolymer of hydroxystyrene and t-butyl acrylate); and e-beam resist material such as poly(methylmethacrylate) (PMMA). In certain embodiments of the present invention, the substrate may be also coated with an antireflective coating (ARC). Examples of suitable ARC coatings used may be any of the coatings manufactured by Brewer Science and Shipley Co. of Marlborough, Mass.

After the resist-coating is applied, the substrate may be baked to evaporate any solvent in the resist composition and to harden the coating onto the substrate. The resist-coated substrate is then exposed to a radiation source to provide a design pattern that is imposed upon the exposed areas of the resist-coated surface. Examples of suitable radiation sources include, but are not limited to, visible light, ultraviolet (UV) light, deep ultraviolet (DUV) light, 157 nm, extended ultraviolet (UV) light, electron beam, or X-ray radiant energy.

Depending upon whether the resist coating is positive or negative, the radiation either increases or decreases its solubility in a subsequently applied, alkaline aqueous developer such as a solution containing tetramethylammonium hydroxide (TMAH). In a positive resist coating, the areas masked from radiation remain after development while the exposed areas are dissolved away. In a negative resist coating, the opposite occurs. In certain preferred embodiments of the present invention, the aqueous solution may be used to treat substrates having a positive resist coating.

The aqueous solution is preferably applied to the surface of the substrate as a prepared solution. In alternative embodiments, however, the aqueous solution can be prepared within the rinse stream just prior to or during contact with the substrate surface. For example, a certain quantity of one or more acetylenic diol derived surfactants can be injected into a continuous stream of water or other solvent medium that optionally includes other additives thereby forming the aqueous solution. In some embodiments of the present invention, the at least one surfactant can be also deposited upon or comprise the material of a high surface area device such as a cartridge or filter (which may or may not include other additives). A stream or water and/or solvent then passes through the cartridge or filter thereby forming the aqueous solution. In still another embodiment of the present invention, the aqueous solution is prepared during the contacting step. In this connection, at least one surfactant is introduced via a dropper or other means to the surface of the substrate. Water and/or other solvent medium is then introduced to the surface of the substrate and mixes with the at least one surfactant on the surface of the substrate thereby forming the aqueous solution.

In an alternative embodiment of the invention, a concentrated composition is provided that may be diluted in water and/or other solvents to provide the aqueous solution. A concentrated composition of the invention, or "concentrate" allows one to dilute the concentrate to the desired strength and pH. A concentrate also permits longer shelf life and easier shipping and storage of the product.

A variety of means can be employed in contacting the aqueous solution with the substrate surface. The actual conditions of the contacting step (i.e., temperature, time, and the like) may vary over wide ranges and are generally dependent on a variety of factors such as, but not limited to, the nature and amount of residue on the surface of the substrate and the hydrophobicity or hydrophilicity of the substrate surface, etc. The contact step can be conducted in either a dynamic method such as, for example, a streamline process for applying the aqueous solution over the surface of the substrate or in a static method such as, for example, a puddle rinse or immersing the substrate within a bath containing the aqueous solution. The aqueous solution may also be sprayed onto the surface of the substrate in a dynamic method such as in a continuous process or sprayed onto the surface and allowed to remain there in a static method. In certain preferred embodiments, the contacting step is conducted in a dynamic method. The duration of the conducting step, or time of contact of the aqueous solution to the substrate surface, can vary from a fraction of a second to hundreds of seconds. Preferably, the duration can range from 1 to 200 seconds, preferably from 1 to 150 seconds, and more preferably from 1 to 40 seconds. The temperature range for the contacting step can vary from 10 to 100° C. and more preferably from 10 to 40° C.

In certain embodiments of the present invention, the substrate may be dried to remove any residual water (and any solvent if added) used to deliver the acetylenic diol type surfactant to the substrate surface. The residual water may be substantially removed via spinning, heating, air drying or other means, to leave a thin film of acetylenic diol surfactant (s) on the the substrate surface. For example, the substrate may be spun at a speed of 500 rpm to drive off the majority of water in the aqueous solution. The drying step may occur after each application of the aqueous solution, i.e., prior to coating the substrate with resist and/or prior to applying the aqueous developer solution.

The wettability of a subsequently applied aqueous-based solution, such as an alkaline aqueous developer solution, can be determined, for example, by measuring the contact angle. In certain preferred embodiments of the present invention, the contact angle of the aqueous developer solution on the surface of a resist-coated substrate is measured at a time interval of 30 seconds.

The invention will be illustrated in more detail with reference to the following examples, but it should be understood that the present invention is not deemed to be limited thereto. In this connection, the aqueous solution of the present invention, and methods for using same, may be used in other applications in which a substrate surface needs to be treated to enhance wettability of a subsequently applied fluid. For the following examples, the wettability of the aqueous solution was measured on the DSA10 Kruss drop shape analyzer provided by Kruss USA of Charlotte, N.C. using the Sessile drop method. In this method, the wetting properties of a localized region on the surface of a resist-coated substrate are estimated by measuring the contact angle between the baseline of a droplet of aqueous developer solution and the tangent at the droplet base. A high-speed camera captured the spreading of the droplet at a speed of 2 frames per second for 2 minutes and the contact angle was measured.

EXAMPLES

Comparative Example 1

Pre-Treatment of a Resist-Coated Substrate Surface with DI Water

A 100 mm silicon wafer provided by Wafernet Inc. of San Jose, Calif. was coated with a SFR 510A phenolic resist coating provided by Shipley Inc. of Marlborough, Mass. using a spin coating process at a spin speed of 3200 rpm. Deionized water is dispensed via dropper onto the surface of the resist-coated wafer that is spinning at a speed of 200 rpm. The resist-coated wafer was allowed to dry for a period of 20 seconds to remove excess water. Afterwards, the contact angle of 0.26N TMAH developer on the resist-coated surface was measured. Table I provides the value of the contact angle at different drop ages expressed in seconds.

Examples 1a through 1d

Pre-Treatment of a Resist-Coated Substrate Surface with the Aqueous Solution of the Present Invention Aqueous solutions of surfactant based on 2,5,8,11-tetramethyl-6-dodecyne-5,8-diol (m+n=4, p+q=0), or DYNOL® 604 surfactant provided by Air Products and Chemicals, Inc. of Allentown, Pa., were prepared in the following manner. A volumetric flask was charged with varying amounts of the surfactant. A certain amount of DI water was added to the volumetric flask to reach a level of 100 ml at room temperature. The mixture was agitated until the surfactant was dissolved therein to form the aqueous solution. The amounts of surfactant in the aqueous solutions of Examples 1a through 1d are provided in Table I.

Four 100 mm silicon wafers provided by Wafernet Inc. of San Jose, Calif. were coated with a SFR 510A phenolic resist coating provided by Shipley Inc. of Marlborough, Mass. using a spin coating process at a spin speed of 3200 rpm. The surfaces of resist-coated substrates were pre-wetted with Examples 1a through 1d aqueous solutions. The resist-coated wafer was allowed to dry for a period of 20 seconds to remove excess water. Afterwards, the contact angle of 0.26N TMAH on the resist-coated substrates was measured. Table I lists the contact angle values at different drop ages expressed in seconds.

As Table I illustrates, the contact angles of TMAH developer on the resist-coated substrate that were treated with the aqueous solutions of the present invention are smaller than the ones for the resist-coated substrates treated with DI water only. This indicates that surfactants are better adsorbed onto resist-coated surfaces that are treated with the aqueous solutions of the present invention thereby improving the wetting between the developer and resist. Further, higher amounts of surfactant within the aqueous solution may lead to more surfactant adsorption and more improved wetting.

TABLE I

| Pre-Wet Composition | Contact Angle (0 seconds) | Contact Angle (5 seconds) | Contact Angle (10 seconds) | Contact Angle (30 seconds) |
|---|---|---|---|---|
| Comp. Ex. 1 - D1 water | 51.7 | 49.7 | 48.6 | 45.8 |
| Ex. 1a - 60 ppm surfactant | 60.5 | 50.4 | 46.6 | 39.4 |
| Ex. 1b - 125 ppm surfactant | 59.4 | 45.7 | 41.4 | 33.7 |
| Ex. 1c - 250 ppm surfactant | 49.0 | 40.3 | 37.0 | 31.1 |
| Ex. 1d - 400 ppm surfactant | 47.3 | 37.4 | 34.5 | 29.1 |

Comparative Example 2

Pre-Treatment of a Resist-Coated Substrate Surface with DI Water

A 100 mm silicon wafer provided by Wafernet of San Jose, Calif. was coated with a SFR 510A phenolic resist coating provided by Shipley Inc. of Marlborough, Mass. using a spin coating process at a spin speed of 3200 rpm. Deionized water is dispensed via dropper onto the wafer coated wafer that is spinning at a speed of 200 rpm. The resist-coated surface was allowed to dry for a period of 20 seconds to remove excess water. Afterwards, the contact angle of 0.26N TMAH developer on the resist surface was measured. Table II provides the value of the contact angle at different drop ages expressed in seconds.

Examples 2a through 2d

Pre-Treatment of a Resist-Coated Substrate Surface with the Aqueous Solution of the Present Invention Aqueous solutions of surfactant based on 2,4,7,9-tetramethyl-5-decyne-4,7-diol (m+n=5, p+q=2), or SURFYNOL® 2502 provided by Air Products and Chemicals, Inc. of Allentown, Pa., were prepared in the following manner. A volumetric flask was charged with varying amounts of surfactant. A certain amount of DI water was added to the volumetric flask to reach a level of 100 ml at room temperature. The mixture was agitated until the surfactant was dissolved therein to form the aqueous solution. The amounts of surfactant in the aqueous solutions of Examples 2a through 2d are provided in Table II.

Four 100 mm silicon wafers provided by Wafernet Inc. of San Jose, Calif. were coated with a SFR 510A phenolic resist coating provided by Shipley Inc. of Marlborough, Mass. using a spin coating process at a spin speed of 3200 rpm. The surfaces of resist-coated substrates were pre-wetted with Examples 2a through 2d aqueous solutions. The resist-coated wafer was allowed to dry for a period of 20 seconds to remove excess water. Afterwards, the contact angles of 0.26N TMAH on the surface of the resist-coated substrates were measured. Table II lists the contact angle values at different drop ages expressed in seconds.

As Table II illustrates, the contact angles of TMAH developer on the resist-coated substrate that were treated with the aqueous solutions of the present invention are smaller than the ones on the resist treated with DI water alone. This indicates that surfactants are better adsorbed onto the resist-coated surface after treating with the aqueous solutions of the present invention thereby improving the wetting between the developer and resist. Further, higher amounts of surfactant within the aqueous solution may lead to more surfactant adsorption and more improved wetting.

TABLE II

| Pre-Wet Composition | Contact Angle (0 seconds) | Contact Angle (5 seconds) | Contact Angle (10 seconds) | Contact Angle (30 seconds) |
|---|---|---|---|---|
| Comp.Ex.2-D1 water | 46.7 | 40.8 | 38.1 | 31.4 |
| Ex. 2a - 60 ppm surfactant | 51.6 | 39.7 | 35.8 | 27.3 |
| Ex. 2b - 125 ppm surfactant | 52.1 | 37.2 | 33.3 | 25.0 |
| Ex. 2c - 250 ppm surfactant | 44.4 | 33.4 | 29.8 | 23.4 |
| Ex. 2d - 400 ppm surfactant | 43.2 | 33.3 | 29.7 | 23.0 |

While the invention has been described in detail and with reference to specific examples thereof, it will be apparent to one skilled in the art that various changes and modifications can be made therein without departing from the spirit and scope thereof.

We claim:

1. A method for improving the wettability of a substrate, the method comprising:

contacting the substrate with an aqueous solution comprising about 10 ppm to about 10,000 ppm of at least one surfactant having the formula (I) or (II):

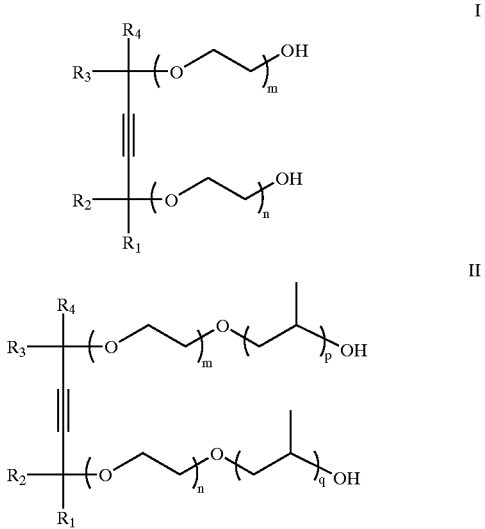

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20;

coating the substrate with a resist coating to provide a resist-coated substrate;

exposing at least a portion of the resist-coated substrate to a radiation source for a time sufficient to provide a pattern on the resist coating; and applying an aqueous developer solution to the substrate to dissolve at least a portion of the resist coating wherein the contacting step is conducted prior to the applying step.

2. The method of claim 1 further comprising the step of contacting the resist-coated substrate with the aqueous solution.

3. The method of claim 1 wherein the aqueous solution further comprises from about 10 to about 10,000 ppm of at least one dispersant.

4. The method of claim 3 wherein the at least one dispersant comprises an ionic compound.

5. The method of claim 3 wherein the at least one dispersant comprises a nonionic compound.

6. The method of claim 1 wherein the value of (n+m) ranges from 0 to 30.

7. The method of claim 6 wherein the value of (n+m) ranges from 1.3 to 15.

8. The method of claim 1 wherein the value of (p+q) ranges from 0 to 30.

9. The method of claim 8 wherein the value of (p+q) ranges from 1 to 10.

10. The method of claim 1 wherein the aqueous solution is formed prior to the contacting step.

11. The method of claim 1 wherein the aqueous solution is formed during the contacting step.

12. A method for improving the wettability of a sustrate, the method comprising:
    contacting the substrate with an aqueous solution comprising about 10 ppm to about 10,000 ppm of at least one surfactant having the formula (I) or (II):

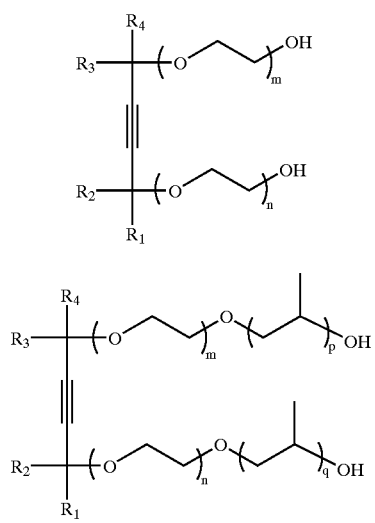

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20;
    coating the substrate with a resist coating to provide a resist-coated substrate;
    exposing at least a portion of the resist-coated substrate to a radiation source for a time sufficient to provide a pattern on the resist coating; and
    applying an aqueous developer solution to the substrate to dissolve at least a portion of the resist coating wherein the contacting step is performed before the coating step.

13. The method of claim 1 wherein the contacting step is performed after the coating step.

14. A method for improving the wettability of a substrate, the method comprising:
    contacting a substrate with an aqueous solution comprising about 10 ppm to about 10,000 ppm of at least one surfactant having the formula:

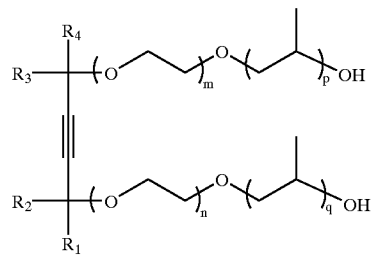

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p and q are numbers that range from 0 to 20;
    coating the substrate with a resist coating to provide a resist-coated substrate;
    exposing at least a portion of the resist-coated substrate to a radiation source for a time sufficient to provide a pattern on the resist coating; and
    applying an aqueous developer solution to the substrate to dissolve at least a portion of the resist coating wherein the contacting step is conducted prior to the applying step.

15. A method for improving the wettability of a substrate by reducing a contact angle of an aqueous developer solution on the surface of the substrate, the method comprising:
    contacting the substrate with an aqueous solution comprising about 10 ppm to about 10,000 ppm of at least one surfactant having the formula (I) or (II):

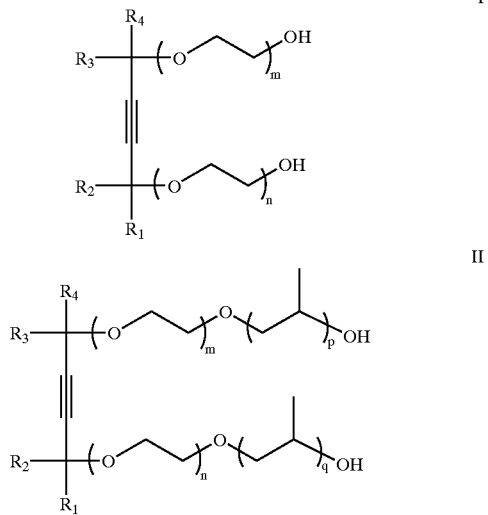

wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20;
    coating the substrate with a resist coating to provide a resist-coated substrate;
    exposing at least a portion of the resist-coated substrate to a radiation source for a time sufficient to provide a pattern on the resist coating;
    contacting the resist-coated substrate with the aqueous solution; and
    applying an aqueous developer solution to the substrate to dissolve at least a portion of the resist coat wherein the first and the second contacting steps are conducted prior to the applying step.

16. The method of claim 15 wherein contact angle of the aqueous developer solution on the surface of the resist-coated substrate is about 60° or less at 30 seconds.

17. The method of claim 16 wherein the contact angle of the aqueous developer solution on the surface of the resist-coated substrate is about 50° or less at 30 seconds.

18. The method of claim 17 wherein the contact angle of the aqueous developer solution on the surface of the resist-coated substrate is about 40° or less at 30 seconds.

19. A method for improving the wettability of an aqueous developer solution on a surface of a resist-coated substrate, the method comprising:

providing an aqueous solution comprising about 10 ppm to about 10,000 ppm of at least one surfactant having the formula (I) or (II):

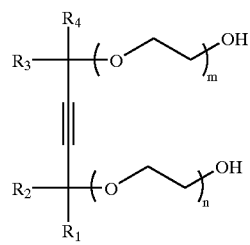

I

-continued

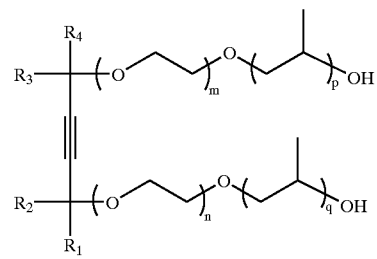

II wherein $R_1$ and $R_4$ are a straight or a branched alkyl chain having from 3 to 10 carbon atoms; $R_2$ and $R_3$ are either H or an alkyl chain having from 1 to 5 carbon atoms; and m, n, p, and q are numbers that range from 0 to 20;

contacting the resist-coated substrate with the aqueous solution; and applying the aqueous developer solution to the resist-coated substrate wherein the contacting step is conducted prior to the applying step.

* * * * *